United States Patent [19]
McKiddy

[11] 3,859,711
[45] Jan. 14, 1975

[54] METHOD OF DETECTING MISREGISTRATION OF INTERNAL LAYERS OF A MULTILAYER PRINTED CIRCUIT PANEL

[75] Inventor: Dewfred R. McKiddy, Endwell, N.Y.

[73] Assignee: International Business Machines Corporation, Armonk, N.Y.

[22] Filed: Mar. 20, 1973

[21] Appl. No.: 343,057

[52] U.S. Cl. ...................... 29/593, 29/624, 29/625, 174/68 S, 324/51, 324/52, 324/73 PC
[51] Int. Cl. ........................................ G01r 31/02
[58] Field of Search ............ 29/624, 625, 592, 593; 174/68 S; 324/51, 52, 73 PC

[56] References Cited

UNITED STATES PATENTS

| | | | |
|---|---|---|---|
| 3,243,498 | 3/1966 | Allen et al. | 174/68.5 |
| 3,516,156 | 6/1970 | Steranko | 174/68.5 |
| 3,564,114 | 2/1971 | Blinder | 29/625 |

*Primary Examiner*—C. W. Lanham
*Assistant Examiner*—Joseph A. Walkowski
*Attorney, Agent, or Firm*—K. P. Johnson

[57] ABSTRACT

Method of detecting misregistration of internal circuit planes of a multilayer circuit panel due to mislocated circuit patterns, shifting of the internal planes during lamination of displaced through-holes. Misregistration of the planes causes the conductive through-holes to be placed too close to or in contact with buried conductors, producing malfunction or decreasing the reliability of the circuit panel. The method includes the steps of forming an electrically conductive non-functional, qualitative test circuit on an internal plane which is located at the limit of maximum allowable tolerances, laminating the internal plane with other circuit planes, drilling a through-hole in the test location specified on the laminated assembly, coating the hole with a conductive material, etching the surface planes and testing for non-acceptable continuity between the test circuit and hole coating. The method is adaptable to both internal signal planes and power planes.

6 Claims, 5 Drawing Figures

METHOD OF DETECTING MISREGISTRATION OF INTERNAL LAYERS OF A MULTILAYER PRINTED CIRCUIT PANEL

BACKGROUND OF THE INVENTION

When constructing multilayer circuit panels, conductive circuit patterns are formed on each insulative substrate layer and several layers are then stacked and laminated together and through-holes are formed and conductive coated. Substrates commonly used include a semicured polymeric resin with imbedded reinforcing fibers. These substrates are formed with accurately placed locating holes for the processing steps. Usually a substrate is coated with copper from which circuits will be etched or the substrate is sensitized to have copper plated onto only selected areas. Actual circuit formation is accomplished by coating the substrate with a photosensitive material and using selectively opaqued mask and actinic light to crosslink the photoresist. After the circuits have been formed, the substrate layers are laid up in the desired order in a laminating press according to the locating holes and the multilayer stack is finally cured by the application of heat and pressure to the resin. The resin serves as a bonding agent to form a unitary, multilayer structure. Thereafter, circuit panels are milled with new locating surfaces and inserted in a drilling machine which forms holes through the laminate. The holes are subsequently plated with a conductive material which interconnects the circuit lines that intersect with the drilling locations.

It will be seen from this process that there are many locating tolerances with which to contend. Examples of these are that the art work or glass master used for exposure may be at one side of the tolerance limit, the locating holes within the individual layers may become enlarged allowing mislocation, the stacked layers may move relative to each other during lamination, or the drilling machine may be at an extreme of allowable tolerance. Upon the occurrence of deviations from the specified location in a common direction, the spacings between through-holes and lines may become too close although not in actual contact, thus causing electrical malfunctions or early failure when the circuit panel is placed in use.

Misregistration of buried circuit planes has been difficult to detect because of the near opacity of the polymeric substrate layers generally used. Non-destructive inspection could only be done by X-rays and, of course, destructive cross-sectioning could be used for this inspection. Although a continuity check could be made between holes and circuit lands to determine both proper and improper connections, such tests are unreliable in locating conductors formed at less than the specified distances from each other. Likewise, first functional usage does not assure specification compliance.

It is accordingly an object of this invention to provide an improved method of detecting misregistration of superposed circuit planes which are relatively displaced beyond the allowable tolerance limits.

It is another object of this invention to provide a method of simply and non-destructively detecting misregistration of superposed circuit planes which is operable with both signal planes and power planes and affords 100 percent testing of all panels.

A further object of this invention is to provide a method of detecting misregistration of internal circuit planes and superposed external planes by the use of the simple and well-known continuity tests.

Another object of this invention is to provide a method of detecting misregistration of superposed circuit planes in a unitary panel which employs an auxiliary conductor surrounding a potential through-hole location which defines the acceptable tolerance limits, and is electrically connected to a through-hole when tolerance limits are exceeded.

SUMMARY OF THE INVENTION

The foregoing objects for an internal signal plane, consisting of printed lines, are attained in accordance with the invention by providing a non-functional conductor on the surface of internal circuit planes prior to lamination which comprises two circular interconnected conductive elements surrounding two respective through-hole locations. The internal diameter of the circular conductors is the nominal size of the through hole plus twice the allowable tolerance dimension. In detecting misregistration, the special conductor is formed at the same time as other conductors on the internal circuit planes and the planes are laminated together in the usual manner with the remaining planes that make up the multilayer panel. Thereafter, through holes are formed at each of the specified panel locations surrounded by the circular conductors and the internal hole surfaces are coated with a conductive material such as copper. A continuity check is made between the two holes at the surface of the panel to determine whether the through-hole coatings are electrically connected.

In the event that permissible tolerances have been exceeded in locating the glass master with respect to the internal substrate or the movement between the circuit planes has occurred during lamination or location of the hole forming device was not within the specified position, then the two holes will contact the two respective ring conductors which are interconnected and a short circuit will appear between the two formed holes. The method of the invention for internal signal planes can also be practiced by using a single non-functional through-hole, if desired, merely by connecting one circular test conductor to a functional land on the internal plane at another through-hole location.

The method lends itself to determination of misregistration of power planes, that is, ground or voltage planes. Power planes are generally continuous copper except for the removal or non-deposition of copper around through-hole locations where no connection is to be made. In the case of power planes, a non-functional through-hole location is chosen and a clearance hole of the power plane is reduced to the dimension of the hole diameter plus twice the allowable tolerance build-up.

The invention has the advantage of being readily incorporated in the final product without any detrimental effect on product performance. It also can be readily incorporated in most circuit layouts because of its negligible need for circuit area, requiring a minimum of one through-hole. There is little, if any, increase in cost for incorporating the test circuit and making the continuity test since panels are usually given a continuity test of all through-holes in any event. Test rings can be formed on each of the internal planes in a multilayer panel, if desired, or used in special, critical planes.

The foregoing and other objects, features, and advantages of the invention will be apparent from the following more particular description of preferred embodiments of the invention as illustrated in the accompanying drawings.

DETAILED DESCRIPTION

Figures 1, 2:
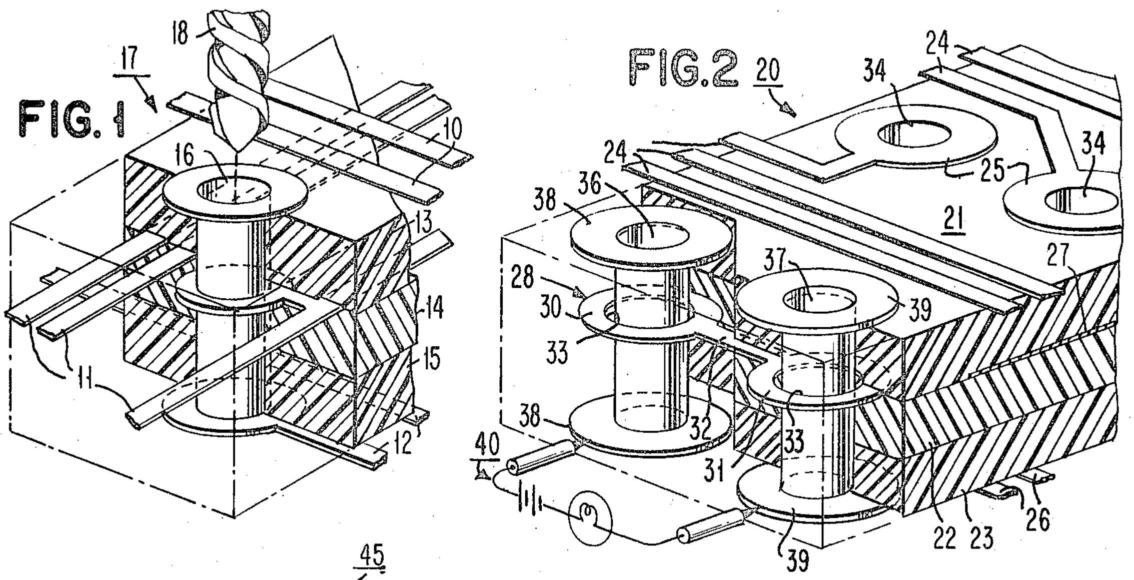
FIG. 1 is a diagram of a typical multilayer circuit panel showing an arrangement of through-hole and conductors commonly experienced.
FIG. 2 is a perspective view partly in section of the misregistration detection ring and circuit of the invention as used in a multilayer circuit panel with internal signal plane.

Referring to FIG. 1, there is shown a typical arrangement of electrical conductors 10, 11, and 12 on respective circuit plane substrates 13, 14, and 15 and metal plated through-hole 16 in a multilayer circuit panel 17, shown partially in phantom. As will be seen, cumulative error in the vertical alignment of the laminate layers or error in the location of drill 18 can adversely affect the spacing between the through-hole and conductors, for example, between conductors 11 and through-hole 16. Conductors are placed close together to achieve maximum packaging density. This requires that the through-holes in the conductors be precisely located with respect to each other. Deviations from the specified positions will change the electrical impedences, resulting in potential cross-talk or performance degradation or possible short circuits with time and environmental conditioning. The alignment difficulty is further magnified by the addition of other internal layers. Some multilayer panels have a dozen or more layers which aggravate the requirement of maintaining minimum spacings among all conductors.

There is shown in FIG. 2 a portion of a larger circuit panel embodying a misregistration detection circuit according to the invention. Circuit panel 20 is a composite structure made up of separately constructed circuit substrates 21, 22, and 23, each having various electrical conductors formed thereon. For example, substrate 21 has linear conductors 24 and conductive circular lands 25 to make up the top external circuit plane; substrate 23 is formed with correspondingly located lands and lines 26 to form the other external circuit plane; and substrate 22 with conductors 27 forms an internal or buried circuit plane. This plane also is provided with a misregistration test circuit 28. Each substrate is usually made from a semicured polymeric resin having reinforced fibers therein such as glass fiber cloth impregnated with B-staged epoxy resin. Panel 20, of course, may have many other conductors and lands forming functional circuits, and the panel can be formed with additional internal circuit planes such as substrate 23.

The misregistration detection circuit 28 is formed of a conductive material, generally of the same material as other circuits on the substrate such as copper, and the circuit is preferably in the shape of two annular rings 30 and 31 interconnected at their adjacent edges by a circuit line 32. The inside diameter 33 of each ring is determined by the dimension of functional through holes 34 to be formed in the circuit panel 20 and the allowable tolerance dimension which is the sum of the allowable tolerances permitted in prescribing the locations of circuit lands and lines on one plane with respect to those on another. The purpose of the annular rings, 30, 31, in other words, is to define radially the limits of misalignment or misregistration which will still produce an acceptable product. Limit definition circuits may be of other configuration depending upon the directional tolerances. Test conductor 26 is preferably formed at the same time by the same process as other circuit lines and lands formed on individual substrate 22.

Circuit formation on the substrates is well known in the art and may be done by subtractive methods such as bonding copper foil to the individual substrates, applying and exposing an etch resist material and selectively etching away the foil to leave the desired circuit lines and lands. Another technique commonly used is that of sensitizing the substrates for the selective chemical reduction or autocatalytic deposition of metal with possible additional build-up through electroplating techniques. With either the subtractive or additive process, there is usually required the exposure of photosensitive resist through a master mask in order to define circuit locations photographically. Locating holes are formed in the substrates for alignment purposes during processing. After the circuit conductors of internal planes have been formed on the respective substrates, the planes are laminated together under heat and pressure to completely cure the semicured resin and form a unitary, composite structure. Hopefully, the circuit lines and lands of the layers are properly aligned after completion of the lamination process.

Through-holes 34 are formed in the circuit panel to interconnect corresponding lands with lines or to power planes in the various layers or to provide the necessary conductive paths for components that are subsequently added. The required through-holes may be formed by any of various techniques, such as commonly used drilling or punching or with high energy beams such as an electron beam or lasers. When drilled or punched, many of the holes are formed simultaneously and the panel is incremented short distances to a new location where the drilling or punching operation is repeated as required. Non-functional holes 36, 37 in lands 38, 39 of the test circuit are formed in the same manner as the holes 34.

After the holes have been formed, their interior surfaces are coated with a conductive material such as chemically reduced copper to provide the actual conductor. Surface planes are etched to form the conductors after the holes are plated. Upon completion of the circuit panel, the usual procedure is to perform continuity checks at all through-holes to determine whether the required circuits have been properly formed.

In the method of the invention, a continuity check with probe circuit 40 is also made between the conductive coatings of holes 36 and 37 or between lands 38 and 39 to determine whether there is a conductive path existing between the two lands. As shown in FIG. 2, through holes 36 and 37 have been formed without engaging the two ring conductors 30 and 31. Hence, no circuit exists which is indicative of acceptable registration of the multilayer panel 20.

Figure 3:
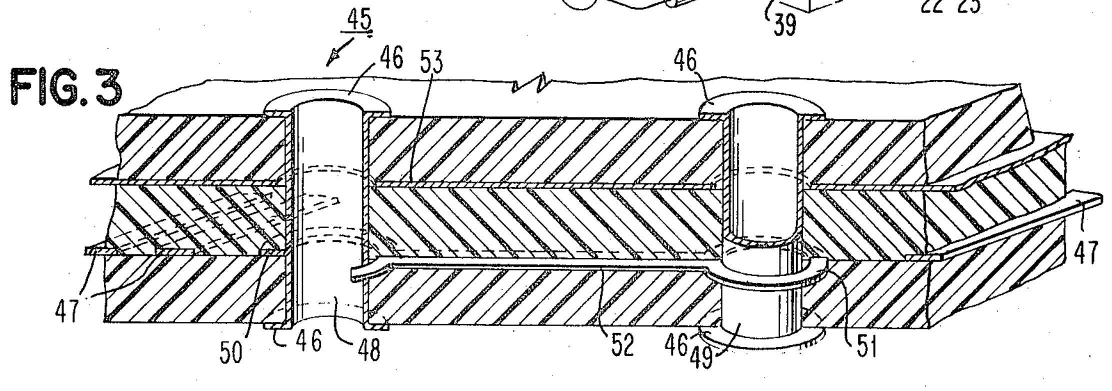
FIG. 3 is a sectional view of a circuit panel incorporating the registration test ring arrangement of the invention as it appears when unacceptable misregistration is detected in a multilayer panel.

An example of misregistration of an internal plane is shown in FIG. 3. A circuit panel 45 having external lands 46 and internal conductors 47 has been drilled after lamination to form holes 48 and 49. When the holes were drilled, annular rings 50 and 51 were engaged and, upon depositing a conductive coating on the interior surfaces of the holes, a conductive path exists from hole 48 along test ring 50, connecting conductor 52 and test ring 51 to hole 49. A continuity test will thus indicate that the misregistration is beyond the allowable limit. An internal power conductor 53 has maintained adequate alignment as noted by the uniform clearance around holes 48 and 49.

Figure 4:
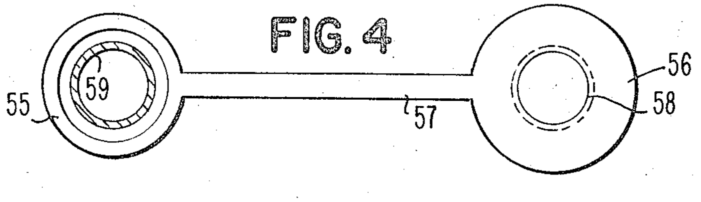
FIG. 4 is a plan view of a test ring according to the invention as adapted for use with a single non-functional through-hole.

In the foregoing description, two non-functional holes have been shown as required for misregistration detection. It is necessary that the registration test circuit be unconnected to any other circuits on the acceptable circuit panels because it is not known how close the holes are to the test rings even though no actual contact has been made. The use of one test ring and one functional hole may be employed, however. In this event, a single registration test ring may be used as illustrated in FIG. 4. Here, test ring 55 is connected to functional hole 50 via land 56 on the same circuit plane by conductor 57. With this arrangement, a continuity test is made between the internal surface of plated hole 58 and that of hole 59. If there is continuity found between the two holes, the panel would be rejected. This arrangement thus reduces the need for two non-functional holes to a single non-functional hole for registration testing. The two test ring method is preferable to the single in that for a marginal but acceptable panel, individual hole location tolerance is less likely to reject the panel for two rings compared to one ring.

Figure 5:
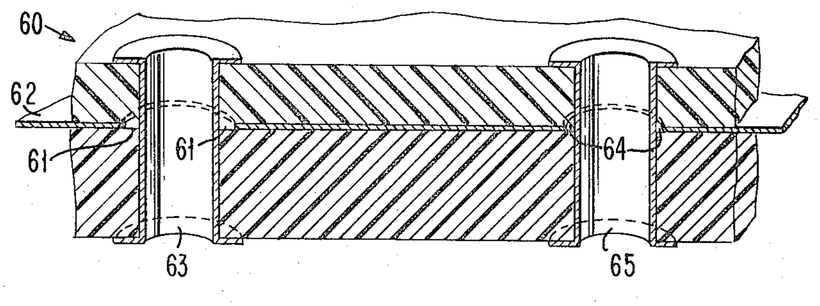
FIG. 5 is a sectional view of a multilayer panel having a power plane incorporating the invention.

In FIG. 5 there is illustrated the principle of the invention when used with an internal power plane. Power distribution planes are generally substantially entirely conductor material with the conductor removed to provide clearance adjacent to through-holes where no connection is desired. A clearance opening 61 is illustrated in plane 62 of panel 60 around through-hole 63. Misregistration detection can be readily accomplished by providing a smaller clearance opening 64 adjacent to a non-functional through-hole 65. The internal diameter of the hole 65 is determined by adding to the hole diameter twice the allowable tolerance dimension as described above. To complete panel construction, a continuity check between the power plane 62 at connected hole 63 and test hole 65 will reveal whether the latter is connected to the power plane through misregistration. Through-hole 65 cannot be used for the usual circuit purposes since normally specified minimum clearances may not be complied with.

Test rings and test clearance holes may be judiciously stacked one above the other to minimize the need for non-functional holes, provided the test patterns and subsequent operations do not themselves cause violation of the specified clearances required.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the construction of a printed circuit panel having a pair of external circuit planes and at least one internal circuit plane, each said plane having electrical conductors on an insulative substrate, the method of determining vertical alignment of said planes, comprising the steps of:

designating predetermined through-hole locations on one of said external circuit planes;

forming an electrically conductive path on said internal circuit plane defining acceptable limits of misregistration at at least one of said through-hole locations of said second plane relative to said external plane;

stacking said external planes with said internal planes so that said internal plane is enclosed between said external planes;

laminating said stacked planes to form a unitary structure;

forming through-holes in said laminate at said designated through-hole locations on said external plane;

coating the surface of said hole with a conductive material; and performing an electrical continuity test between said hole coating and said conductive path to determine whether said stacked planes are within the limits of permissible misregistration.

2. In the construction of a multilayer circuit element, the method of determining alignment of multiple circuit planes therein comprising the steps of:

designating a plurality of prospective through-hole areas on the insulative material of a first circuit plane forming a corresponding plurality of electrically closed conductive paths each surrounding a predetermined area of insulative material on the second circuit plane, said closed conductive paths being electrically interconnected and each said surrounded insulative area having predetermined dimensions at least equal to the transverse dimension of a through-hole plus the allowable dimensional tolerance variation for lateral displacement of said second plane with respect to another plane;

aligning said first and second circuit planes so that each said prospective through-hole area is vertically aligned with a respective insulative area surrounded by one of said closed paths;

laminating said first and second circuit planes together with a third circuit plane to form a unitary structure wherein said second circuit plane is an internal layer;

forming a hole through said laminate at each of said designated areas;

coating the interior of said through holes with a conductive material; and performing an electrical conductivity test among said coated holes to determine whether the conductive coating of the holes is electrically connected to said closed conductive paths on said second circuit plane.

3. The method as set forth in claim 2 wherein one of said through-holes is used for a circuit in addition to said continuity tests.

4. The method as set forth in claim 2 wherein said electrical circuit is an annular conductive ring surrounding said insulative area.

5. In a printed circuit panel having a pair of external circuit planes and at least one internal circuit plane, each said plane having electrical conductors on an insulative substrate, the method of determining vertical alignment of said planes comprising the steps of:

forming a conductive land area on one of said external circuit planes;

forming an electrical conductor on the surface of said internal plane surrounding a predetermined insulative area thereof said surrounded area having a diameter at least equal to the diameter of a through-hole plus the allowable dimensional tolerance for relative lateral displacement of said internal and external planes;

aligning said circuit planes so that said land area is substantially aligned with said enclosed insulative area of said internal plane;

laminating said external and internal circuit planes together to form a unitary structure;

forming a hole through said laminate at said land area of said external plane;

coating the surface of said hole with a conductive material; and performing an electrical continuity test between said conductor and said hole coating to determine the presence or absence of electrical connection to said closed conductive paths.

6. In the construction of a circuit panel having multiple circuit planes, the method of determining circuit plane registration comprising the steps of:

forming a pair of conductive land areas on the insulative material of a first circuit plane;

forming a pair of electrically interconnected closed conductive paths each surrounding a predetermined area of insulative material on a second circuit plane said surrounded area having a diameter at least equal to the diameter of a through-hole plus the allowable dimensional tolerance for relative lateral displacement of said second and said first and third planes;

vertically aligning said first and second circuit planes with each said land area in substantial alignment with the insulative area of said second circuit plane surrounded by one of said closed conductive paths;

laminating said first and second circuit planes together with a third circuit plane to produce a unitary structure wherein said second circuit plane becomes an internal plane;

drilling a hole through said laminate at each said land areas;

coating the interior of said holes with a conductive material; and performing an electrical continuity test between said lands to determine the presence or absence of electrical connection between said closed paths and said lands.

* * * * *